United States Patent
Briggs

(10) Patent No.: US 8,592,965 B1
(45) Date of Patent: *Nov. 26, 2013

(54) ON-DIE BOND WIRES SYSTEM AND METHOD FOR ENHANCING ROUTABILITY OF A REDISTRIBUTION LAYER

(75) Inventor: Randall D. Briggs, Boise, ID (US)

(73) Assignee: Marvell International Technology Ltd., Hamilton (BM)

( * ) Notice: Subject to any disclaimer, the term of this patent is extended or adjusted under 35 U.S.C. 154(b) by 2 days.

This patent is subject to a terminal disclaimer.

(21) Appl. No.: 13/323,729

(22) Filed: Dec. 12, 2011

Related U.S. Application Data

(60) Continuation of application No. 12/774,634, filed on May 5, 2010, now Pat. No. 8,076,164, which is a division of application No. 11/391,625, filed on Mar. 27, 2006, now Pat. No. 7,714,450.

(51) Int. Cl.
*H01L 23/02* (2006.01)
*H01L 23/48* (2006.01)

(52) U.S. Cl.
USPC .......................... 257/686; 257/777; 257/784

(58) Field of Classification Search
USPC .......................................... 257/686, 777, 784
See application file for complete search history.

(56) References Cited

U.S. PATENT DOCUMENTS

| | | | |
|---|---|---|---|
| 5,612,575 A | 3/1997 | De Givry | |
| 6,605,875 B2 | 8/2003 | Eskildsen | |
| 6,630,372 B2 | 10/2003 | Ball | |
| 6,727,116 B2 | 4/2004 | Poo et al. | |
| 6,781,226 B2 | 8/2004 | Huppenthal et al. | |
| 6,836,002 B2 * | 12/2004 | Chikawa et al. | 257/666 |
| 6,888,259 B2 | 5/2005 | Ishikawa et al. | |
| 7,224,055 B2 | 5/2007 | Kim et al. | |
| 7,411,292 B2 * | 8/2008 | Chen et al. | 257/724 |
| 7,422,930 B2 | 9/2008 | Thomas et al. | |
| 2002/0030975 A1 | 3/2002 | Moon | |
| 2002/0093088 A1 | 7/2002 | Wang | |
| 2003/0006534 A1 | 1/2003 | Tabaos et al. | |
| 2004/0232559 A1 | 11/2004 | Adelmann | |
| 2005/0133935 A1 | 6/2005 | Vasishta et al. | |
| 2005/0164486 A1 * | 7/2005 | Lua et al. | 438/617 |
| 2005/0184375 A1 * | 8/2005 | Goller et al. | 257/678 |
| 2006/0049507 A1 * | 3/2006 | Ohkura | 257/690 |
| 2006/0108676 A1 | 5/2006 | Punzalan et al. | |
| 2006/0258044 A1 | 11/2006 | Meyer et al. | |
| 2006/0286822 A1 | 12/2006 | Thomas et al. | |
| 2007/0045862 A1 * | 3/2007 | Corisis et al. | 257/777 |
| 2007/0069390 A1 * | 3/2007 | Chen et al. | 257/777 |
| 2007/0132081 A1 * | 6/2007 | Wang et al. | 257/686 |

* cited by examiner

*Primary Examiner* — James Mitchell

(57) ABSTRACT

An integrated circuit includes a first die and a second die positioned in a package. The first die has a redistribution layer formed on the die and including a plurality of relocated bond pads. The relocated bond pads are positioned near an inner edge of the first die that is adjacent to an inner edge of the second die. Each relocated bond pad is coupled to a corresponding bond pad on the second die through a respective bonding wire. The first die further includes a plurality of original bond pads. The redistribution layer further includes at least one intermediate bond pad electrically interconnected through a respective conductive trace to a corresponding original bond pad. Each intermediate bond pad is electrically connected to a corresponding relocated bond pad through a respective bond wire.

20 Claims, 5 Drawing Sheets

ON-DIE BOND WIRES SYSTEM AND METHOD FOR ENHANCING ROUTABILITY OF A REDISTRIBUTION LAYER

CROSS REFERENCE TO RELATED APPLICATIONS

This present disclosure is a continuation of U.S. application Ser. No. 12/774,634, filed on May 5, 2010, which is a divisional of U.S. application Ser. No. 11/391,625 (now U.S. Pat. No. 7,714,450), filed Mar. 27, 2006.

BACKGROUND OF THE INVENTION

Integrated circuits or electronic chips are ubiquitous, being contained in many electronic devices used by a person during a typical day, such as in cellular telephones, personal computers, automobiles, and even common household appliances like toasters. A chip includes a semiconductor die, which is made of semiconductor material such as silicon, and in which desired electronic circuitry is formed. For example, a memory chip is a chip containing a die in which electronic circuitry is formed for storing and retrieving data. A chip also includes a package that houses the die and includes pins that provide for electrical interconnection of the chip to external electronic components. Various different types of packages are utilized for chips, with the specific type of package being determined by numerous factors such as required heat dissipation, the physical size of the chip, and the number of interconnections needed from the die to external electronic components. Common packages for chips include single in-line packages (SIPs), dual in-line packages (DIPs), plastic leaded chip carriers (PLCC), Thin Small Outline Packages (TSOPs), pin-grid arrays (PGAs), ball-grid arrays (BGAs), and quad flat packs (QFPs).

In some situations, more than one die is housed in a given package to form what is commonly referred to as a "system in a package" (SIP) device or simply a SIP. The two or more die in this situation must be electrically interconnected, and depending on the type of package this interconnection may present difficulties. These difficulties often occur when using any type of package including a lead frame, such as the DIP, PLCC, TSOP, and QFP packages previously mentioned. For example, a quad-flat pack (QFP) is a package having pins or external leads that project from all four sides of the package. QFP packages are relatively cheap and also are relatively thin (i.e., have a small height) compared to other types of packages, and accordingly may be utilized where cost and height of the package are of concern. A QFP package includes a lead frame and the physical structure of the lead frame and overall QFP package makes the interconnection of multiple dies in such a package problematic.

FIG. 1 is a simplified top view of a portion of a chip including a conventional QFP package containing a lead frame 100. The lead frame 100 includes a die paddle 102 on which two die 104 and 106 are mounted. For example, the die 104 could be a dynamic random access memory (DRAM) and the die 106 a memory controller that are being combined to form a SIP. The die paddle 102 is supported by four support arms 108 (commonly called tie bars) attached to respective corners of the die paddle. Arranged around the periphery of the die paddle 102 are a number of bond fingers 110, several of which are shown along the top, bottom, left, and right edges of the paddle. These bond fingers 110 typically extend from all four sides of the QFP package to form the external leads of the package and are also coupled or connected through respective bonding wires 112 to corresponding bond pads 114 on one of the dies 104 and 106. Each bond finger 110 functions to route a respective electrical signal to or from the dies 104 and 106. All signals required for operation of the dies 104 and 106 are routed to and from the dies either through the bond fingers 110, such as ground signals, supply voltages, controls signals, data signals, address signals, and so on, or between each die through bond wires 112. The specific type and number of such signals depends on the types of the dies 104 and 106.

The die paddle 102, bond fingers 110, bonding wires 112, and bond pads 114 are all formed from electrically conductive material, such as a metal, as will be appreciated by those skilled in the art. The illustrated bond pads 114 on each of the dies 104 and 106 merely serve to indicate that each die includes such bond pads and the number and arrangement of such bond pads will of course vary for different types of dies. The die paddle 102 is typically metal and is typically utilized as a ground plane, meaning that the paddle is coupled through bonding wires 112 to bond fingers 110 that receive a ground signal GND. A bond finger 110a, for example, positioned along the top left edge of the die paddle 102 receives the ground signal GND and is coupled through a respective bonding wire 112a to the die paddle 102. Any bond pads 114 on the dies 104 and 106 that are to be coupled to ground are then simply "down bonded" to the die paddle 102, meaning such bond pads are coupled directly to the die paddle via a corresponding bonding wire 112. Several examples of down bonded ground wires are shown in FIG. 1, such as the bond pad 114a formed along the top edge of the die 106 that is down bonded to the die paddle 102 through the bonding wire 112b.

The dies 104 and 106 are interconnected through bond pads 114b positioned along an inner edge of the die 104 and bond pads 114c positioned along an inner edge of the die 106. The interconnection of these bond pads 114b and 114c through bonding wires 112 is simple when the bond pads on the dies 104 and 106 line up, which is the case in the example illustrated in FIG. 1. More specifically, the uppermost bond pad 114b is connected to the uppermost bond pad 114c through an uppermost bonding wire 112, with the second from the top bond pad 114b being connected to the second from the top bond pad 114c through a bonding wire 112, and so on for pairs of bond pads 114b and 114c from top to bottom.

The structure of a QFP package, along with other types of packages including lead frames, requires that bonding wires 112 be used to directly interconnect the bond pads 114 to the bond fingers 110 as required. The same is true of the interconnection of the bond pads 114b along the inner edge of die 104 and the bond pads 114c along the inner edge of die 106. This is in contrast to other types of packages such as ball grid arrays where there is an underlying substrate on which the two die 104 and 106 are mounted. This substrate functions like a miniature circuit board and simplifies the routing of signals between the bond fingers 110 and the bond pads 114 as well as signals between the two dies 104 and 106.

When the bond pads 114b along the inner edge of die 104 do not line up as required with bond pads 114c along the inner edge of die 106, a problem arises in properly electrically interconnecting the two dies. This is true, for example, because short circuits may arise if the bonding wires 112 cross over one another in interconnecting the bond pads 114b and 114c or if bond pads on the two dies 104 and 106 that are to be interconnected are not located along the respective inner edges of the dies. Unless the two dies 104 and 106 have been originally designed for use in SIP applications, it is unlikely the bond pads 114b and 114c will line up as required.

One approach to ensuring the bond pads 114b and 114c line up as required is to alter the designs of the dies 104 and 106 so as to reposition the location of the bond pads along the inner edge of each die to be directly across from the corresponding bond pad on the other die. Ideally, however, it is desirable for the same dies 104 and 106 to be utilized whether the dies are being placed in a QFP package, a ball grid array package, or any other type of package. Repositioning the bond pads 114b and 114c that are located along the inner edges of the dies 104 and 106 may make the die unsuitable for use individually in other types of standard packages. Moreover, this redesign of dies 104 and 106 is relatively expensive and time consuming since it involves the cost of new mask layers used in the die fabrication process and the time it takes to fabricate new die.

Another approach for enabling the required electrical interconnection of the dies 104 and 106 is an interposer layer positioned under the dies. The interposer layer functions similar to the substrate previously described for a ball grid array to electrically interconnect required bond pads on the two dies 104 and 106. Once again, however, this approach is relatively expensive and therefore generally undesirable. Moreover, an interposer layer also increases the vertical height of the QFP package and thereby contravenes one major advantage of a QFP package, namely the small overall height of the QFP package. The same is true for the approach of stacking the two dies 104 and 106, which may not be practical if the size of the two dies are incompatible and also undesirably affects the heat dissipation and overall height of the QFP package.

Yet another approach for aligning bond pads 114b and 114c along the inner edges of the dies 104 and 106 is to relocate the pad locations using a redistribution layer ("RDL") formed as an additive process on the top of one or both of the dies. As its name implies, such a redistribution layer redistributes or repositions the locations of underlying bond pads 114 on the dies 104 and 106. With this approach, the bond pads 114h and 114c along the inner edges of the dies 104 and 106 would be repositioned as required to enable proper interconnection of the two dies.

FIG. 2 is a simplified top view of a portion of a lead frame 200 including a die paddle 202 on which two dies 204 and 206 are mounted. A redistribution layer 208 is formed on the die 204 to provide relocated bond pads 210 along the inner edge of the die. These relocated bond pads 210 are properly aligned with corresponding bond pads 212 positioned along an inner edge of the die 206 such that bonding wires 214 may be used to electrically interconnect the bond pads on the two dies. The redistribution layer 208 includes a number of electrically conductive traces 216 that electrically interconnect the bond pads 210 along the inner edge of the die 204 to bond pads positioned along other edges of the die. For example, electrically conductive traces 216 in the redistribution layer 208 interconnect original bond pads 218 positioned along a bottom edge of the die 204 to corresponding bond pads 210 along the inner edge. Similarly, electrically conductive traces 216 interconnect original bond pads 220 along a top edge of the die 204 to corresponding bond pads 210 along the inner edge. The redistribution layer 208 includes numerous conductive traces 216, with only some of the traces being labeled in FIG. 2 in order to simplify the figure. The bond pads 218 and 220 are electrically interconnected through bonding wires 222 to bond fingers (not shown) as previously discussed with reference to FIG. 1.

While the use of the redistribution layer 208 for relocating the bond pads 218, 220 is less expensive and faster than modifying the dies 204 and 206 themselves, there are limitations to this approach. First, the redistribution layer 208 must be designed and physically formed on one or both the dies 204 and 206 to provide the required electrical interconnections. At present, the redistribution layer 208 is limited to a single layer structure, which limits the routing of the electrically conductive traces 216. This is true because the relocated bond pads 210 must be electrically interconnected through respective traces 216 to the required original pads 218 and 220. Depending on the number and order of the relocated bond pads 210, the conventional single layer redistribution layer 208 may not be able to provide all the required electrical interconnections. For example, if a bond pad 220 located along the upper-right edge of the die 204 needs to be connected to one of the relocated bond pads 210 near the bottom edge of the die, the routing of the required trace 216 could be difficult or impossible. As a result, the option of using the single layer redistribution layer 208 may not be available in some situations. Multilayer redistribution layers are not currently available for use in mass production SIPs and thus is not an option in commercial situations.

There is a need in QFP or other leadframe packages that include more than one die for simply, inexpensively, and reliably interconnecting all dies contained in the package.

SUMMARY OF THE INVENTION

According to one aspect of the present invention, an integrated circuit includes a first die and a second die positioned in a package. The first die has a redistribution layer formed on the die and including a plurality of relocated bond pads. The relocated bond pads are positioned near an inner edge of the first die that is adjacent to an inner edge of the second die. Each relocated bond pad is coupled to a corresponding bond pad on the second die through a respective bonding wire. The first die further includes a plurality of original bond pads. The redistribution layer further includes at least one intermediate bond pad electrically interconnected through a respective conductive trace to a corresponding original bond pad. The redistribution layer also includes at least one intermediate bond pad electrically interconnected through a respective conductive trace to a corresponding relocated bond pad. Each pair of intermediate bond pads is electrically connected through a respective bond wire.

DETAILED DESCRIPTION OF PREFERRED EMBODIMENTS

Figure 1:
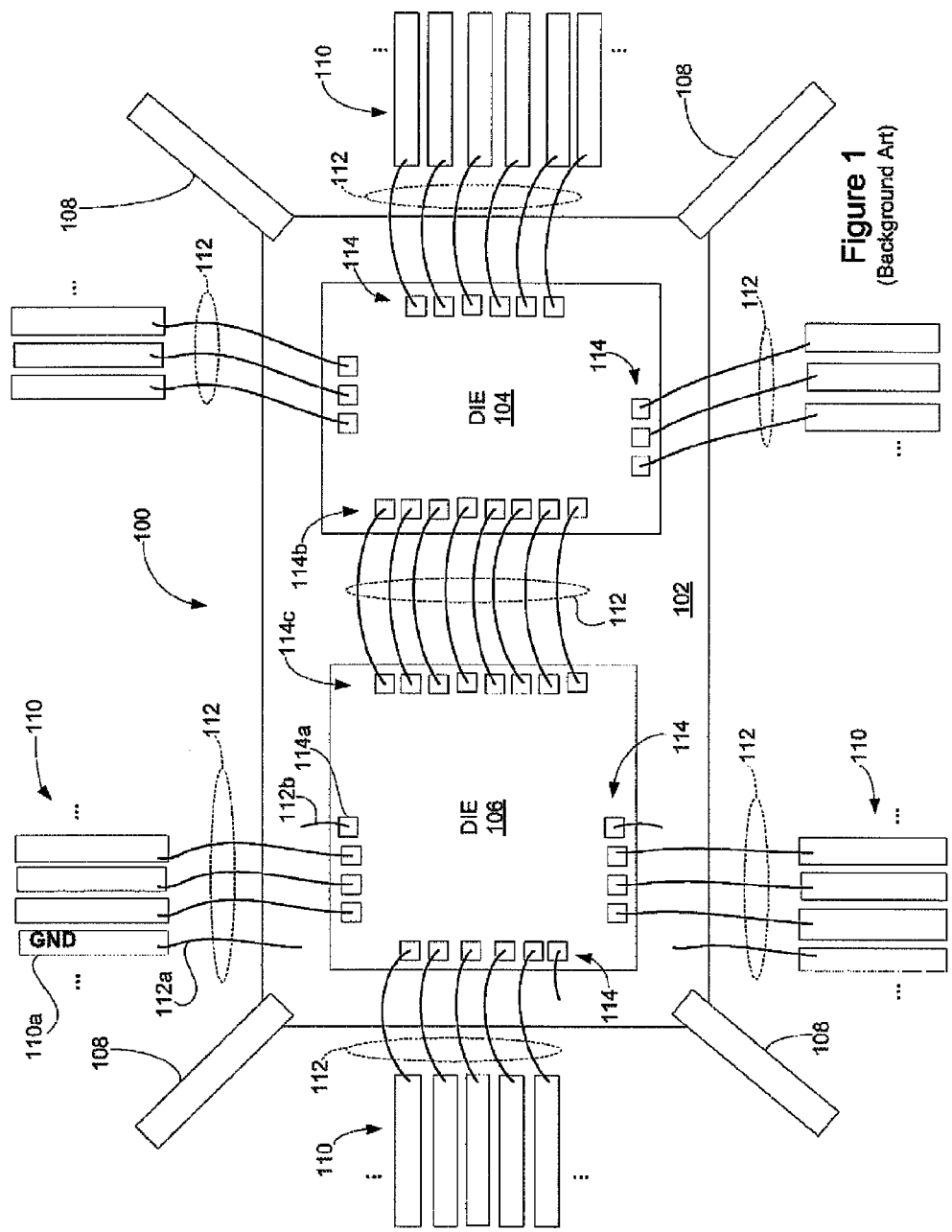
FIG. 1 is a simplified top view of a portion of an SIP chip including a conventional QFP package containing two die and a lead frame.
Figure 2:
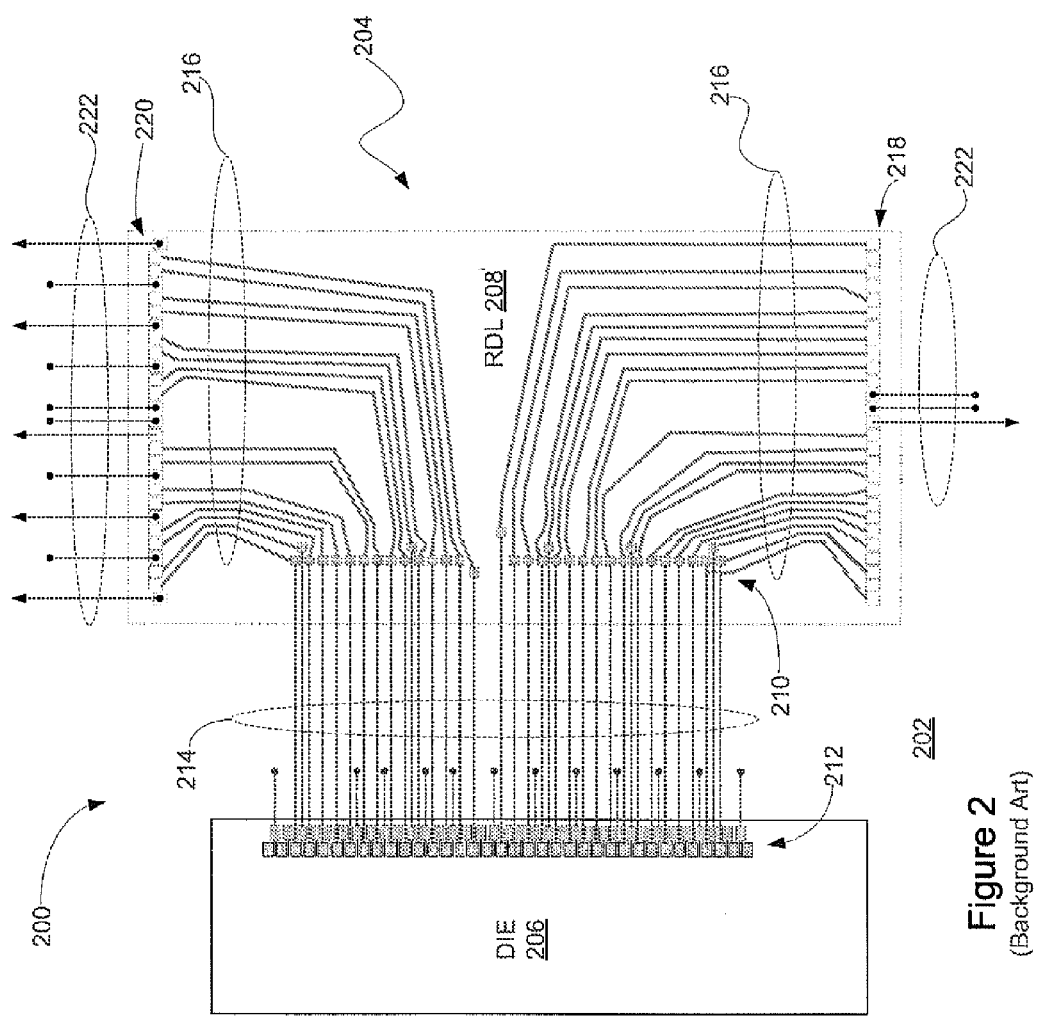
FIG. 2 is a simplified top view of a portion of an SIP chip including a QFP package containing a first die and a second die on which is formed a redistribution layer for providing required electrical interconnection to the first die.
Figure 3:
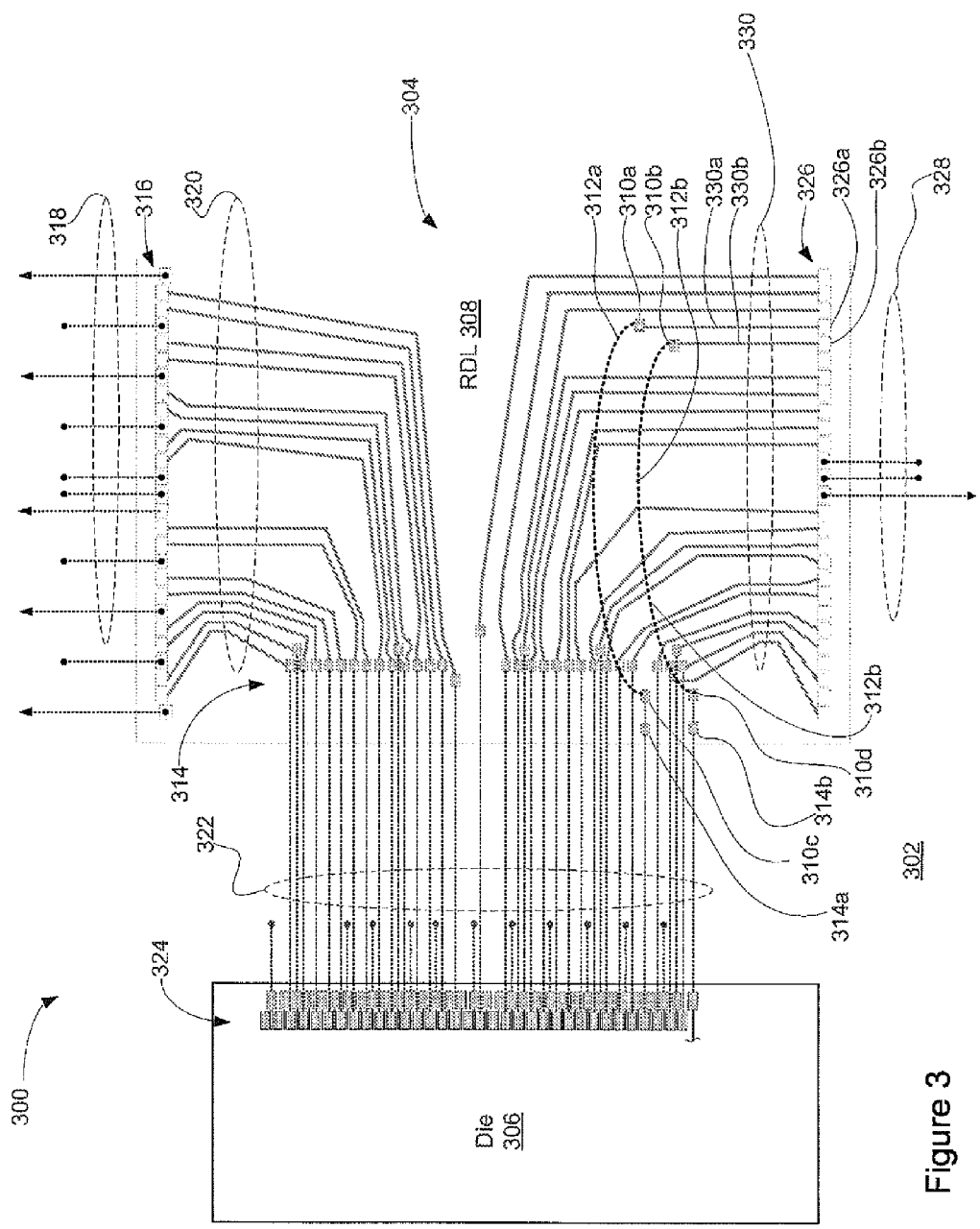
FIG. 3 is a simplified top view of a portion of an SIP chip including a first die and a second die on which is formed a redistribution layer having selected bond pads interconnected through bonding wires according to one embodiment of the present invention.

FIG. 3 is a simplified top view of a portion of an SIP chip 300 including a package 302 containing a first die 304 and a second die 306 and having a single layer redistribution layer 308 formed on top of the die 304 enabling required electrical interconnections between the two dies. The redistribution layer 308 includes intermediate bond pads 310a and 310b that are electrically interconnected through respective inter-RDL bonding wires 312a and 312b to corresponding intermediate bond pads 310c and 310d. The use of the intermediate bond pads 310a, 310b, 310c, and 310d enables the routing of all required electrical signals between the dies 304 and 306 with only the single layer redistribution layer 308. In this way, the redistribution layer 308 eliminates the need for redesigning the dies 304 and 306 and also eliminates the need for the use of a two-layer redistribution layer or interposer layer in order to provide all required electrical connections between the dies, as will be described in more detail below.

In the following description, certain details are set forth in conjunction with the described embodiments of the present invention to provide a sufficient understanding of the invention. One skilled in the art will appreciate, however, that the invention may be practiced without these particular details. Furthermore, one skilled in the art will appreciate that the example embodiments described below do not limit the scope of the present invention, and will also understand that various modifications, equivalents, and combinations of the disclosed embodiments and components of such embodiments are within the scope of the present invention. Embodiments including fewer than all the components of any of the respective described embodiments may also be within the scope of the present invention although not expressly described in detail below. Finally, the operation of well known components and/or processes has not been shown or described in detail below to avoid unnecessarily obscuring the present invention. Also note that in the present description when referring generally to a plurality of the same type of component, such as bond pads, a number descriptor will be utilized and when referring to a specific one of the plurality of components a letter designation may be appended to the number to more precisely identify a specific one of the components.

Die 304 includes a group of upper original bond pads 316 positioned along its upper edge. Some of these upper bond pads 316 are coupled to bond fingers (not shown) of the package 302 through bonding wires 318 for providing required external signals to the die 304. Other upper bond pads 316 are coupled to the die paddle to provide a ground connection. Other ones of the upper bond pads 316 are then connected through a number of electrically conductive traces 320 to corresponding relocated bond pads 314 positioned along the inner edge of the die 304. Each of these relocated bond pads is connected through a respective bonding wire 322 to a corresponding bond pad 324 positioned along an inner edge of the die 306.

Die 304 further includes a group of lower original bond pads 326 positioned along its lower edge. As with the upper bond pads 316, some of the lower bond pads 326 are coupled to bond fingers (not shown) of the package 302 through bonding wires 328 for providing required external signals to the die 304. Other lower bond pads 326 are coupled to the die paddle to provide a ground connection. Other ones of these lower bond pads 326 are then connected through a number of electrically conductive traces 330 to corresponding relocated bond pads 314 positioned along the inner edge of the die 304. The relocated bond pads 314 include the bond pads 314a and 314b previously mentioned, and each of these relocated bond pads 314 is once again connected through a respective bonding wire 322 to a corresponding bond pad 324 positioned along the inner edge of the die 306.

In the embodiment of FIG. 3, two of the lower bond pads 326, which are designated 326a and 326b, are connected through conductive traces to the intermediate bond pads 310a and 310b, respectively. These intermediate bond pads 310a and 310b are not positioned near the inner edge of the die 304 as are the relocated bond pads 314. Relocated bond pads 314a and 314b are also connected through conductive traces to intermediate bond pads 310c and 310d, respectively. The function of the intermediate bond pads 310a, 310b, 310c, and 310d is to enable a required electrical connection between the lower bond pads 326a and 326b and the relocated bond pads 314a and 314b to be formed through the inter-RDL bonding wires 312a and 312b when such an electrical connection may not be formed conventionally through the conductive traces 330.

The intermediate bond pads 310a, 310b, 310c, and 310d in concert with inter-RDL bond wires 312a and 312b enable the single layer redistribution layer 308 to provide all required electrical connections to the die 306. In the example embodiments of FIG. 3, the lower bond pads 326a and 326b are positioned in the lower right corner of the die 304 and must be connected to relocated bond pads 314a and 314b positioned in the lower left corner of the die. This is not possible without the conductive traces 330 crossing one another, which would result in the undesired short circuit of multiple signals in a single layer structure. Other situations can arise as well which will prevent all required upper and lower bond pads 316 and 326 from being connected through conductive traces 320 and 330 to desired relocated bond pads 314.

The intermediate bond pads 310a and 310b are formed on the redistribution layer 308 at locations that enable the inter-RDL bonding wires 312a and 312b to be reliably routed between the intermediate bonding pads and the intermediate bonding pads 310c and 310d, respectively. Accordingly, each of the lower bond pads 326a and 326b is connected to the corresponding intermediate bond pad 310a and 310b through a respective conductive trace 330a and 330b running vertically in the example of FIG. 3. The conductive trace 330a connecting the intermediate bond pad 310a and the lower bond pad 326a is slightly longer than the conductive trace 330b connecting the intermediate bond pad 310b and lower bond pad 326b. This vertically staggers the intermediate bond pads 310a and 310b so as to enable routing of the inter-RDL bonding wires 312a and 312b without these bonding wires interfering with one another. For example, if the traces 330a and 330b were the same length, and a short circuit could result between the inter-RDL bonding wires 312a and 312b, as will be appreciated by those skilled in the art.

In operation, for electrical signals being applied to the die 306 the signals are applied to the lower bond pads 326a and 326b and then propagate through the respective conductive traces 330a and 330b to the intermediate bond pads 310a and 310b. From the intermediate bond pads 310a and 310b, the signals then propagate through the inter-RDL bonding wires 312a and 312b to the intermediate bond pads 310c and 310d, respectively. In the example of FIG. 3, the intermediate bond pad 310c is interconnected through a short conductive trace to an adjacent relocated bond pad 314a while the intermediate bond pad 310d is interconnected through a short conductive trace to an adjacent relocated bond pad 314b. These adjacent relocated bond pads 314a and 314b are provided to enable reliable interconnection of bonding wires 322 between the relocated bond pads and corresponding bond pads 324 on the die 306. More specifically, since the inter-RDL bonding wires 312a and 312b are attached to the intermediate bond pads 310c and 310d, the separate relocated bond pads 314a and 314b allow the required bonding wires 322 to be attached to the relocated bond pads 314a and 314b without disturbing the connection between the bonding wires 312a and 312b and the intermediate bond pads 310c and 310d.

Returning now to the propagation of the signals applied to the lower bond pads 326a and 326b, after propagating through the bonding wires 312a and 312b the signals propagate through the short traces interconnecting the intermediate bond pads 310c and 310d and relocated bond pads 314a and 314b and then through the respective bonding wires 322 to the corresponding bond pads 324 on the die 306. For signals being applied to the lower bond pads 324 the propagation path of the signals is simply reversed.

The die 306 may also normally include a redistribution layer, like the redistribution layer 308 on the die 304. Merely for ease of explanation, in the embodiment of FIG. 3, only the redistribution layer 308 formed on the die 304 is shown and described in detail. In other embodiments, the package 302 includes an additional die and one or more of these additional dies include a redistribution layer analogous to the redistribution layer 308 for providing required electrical interconnections to other ones of the dies. The dies 304 and 306 and any other die contained in the package 302 can be any type of die and will of course be determined by the intended function of the SIP chip 300. In one embodiment, the die 306 is a memory device such as a dynamic random access memory (DRAM) while the die 304 is a memory controller. Also as mentioned throughout, the package 300 may be any suitable type of package, such as a QFP package or ball grid array. Furthermore, the dies 304 and 306 in the chip 300, and any additional die as well, can be arranged in a side-by-side arrangement as in the example of FIG. 3 or can be stacked in other embodiments of the present invention, with the inter-RDL bond wires being applied to a topmost die.

Figure 4:
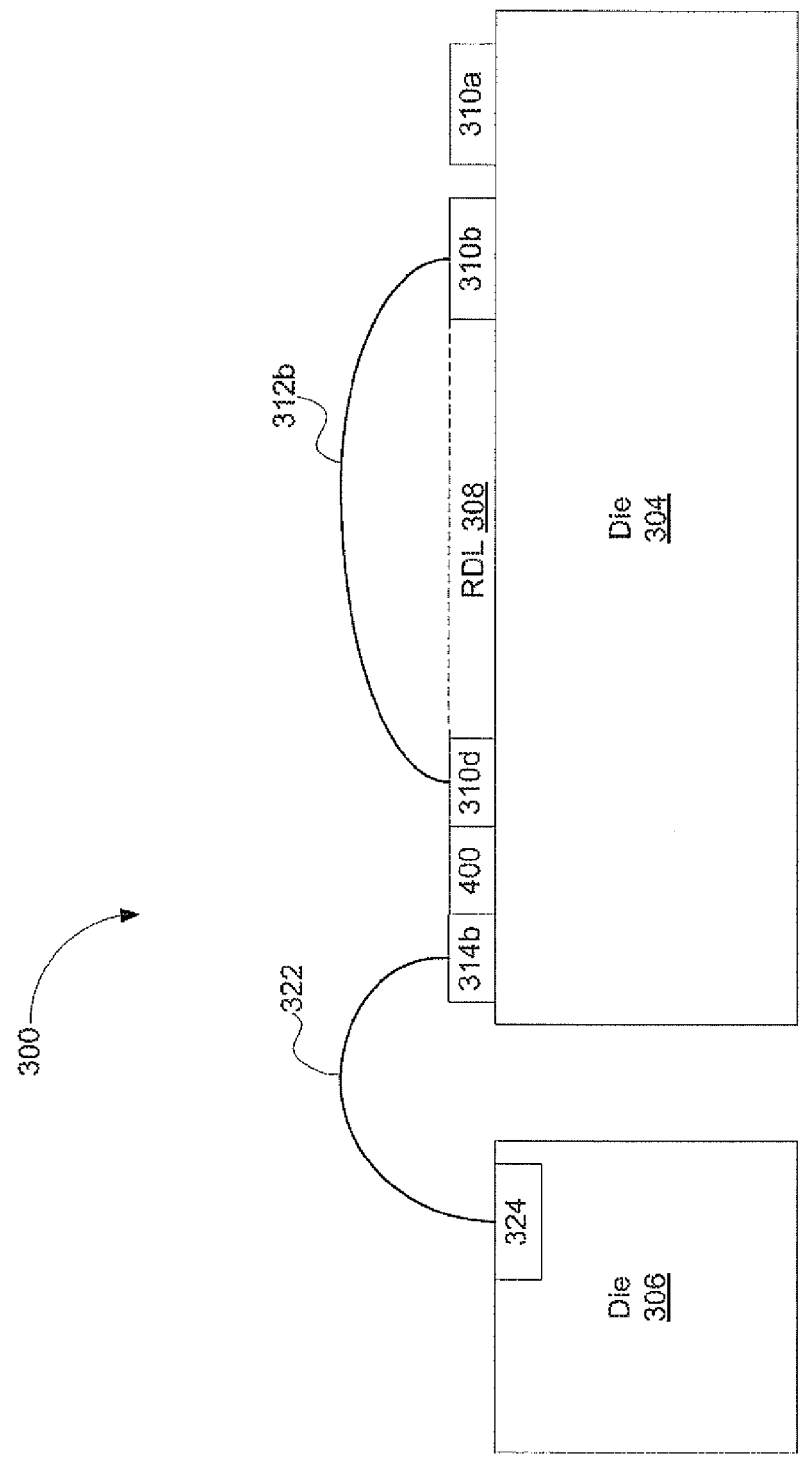
FIG. 4 is a simplified cross-sectional view illustrating the location and interconnection of intermediate bond pads and relocated bond pads in the redistribution layer 308 of FIG. 3

FIG. 4 is a simplified cross-sectional view illustrating the location and interconnection of the intermediate bond pads 310a and 310b, the intermediate bond pads 310c and 310d, and the relocated bond pads 314a and 314b in the redistribution layer 308 of FIG. 3. The intermediate bond pad 310b is connected through bonding wire 312b to the intermediate bond pad 310d which, in turn, is connected through a short conductive trace designated 400 to the relocated bond pad 314b. The relocated bond pad 314b is then connected through bonding wire 322 to a corresponding bond pad 324 on the die 306. The intermediate bond pad 310a is also shown in FIG. 4 and would be connected in an analogous way to the corresponding components discussed in FIG. 3, although this is not illustrated in FIG. 4 since the cross-sectional view does not lend itself to illustrating such interconnections for both intermediate pads 310a and 310b.

Figure 5:
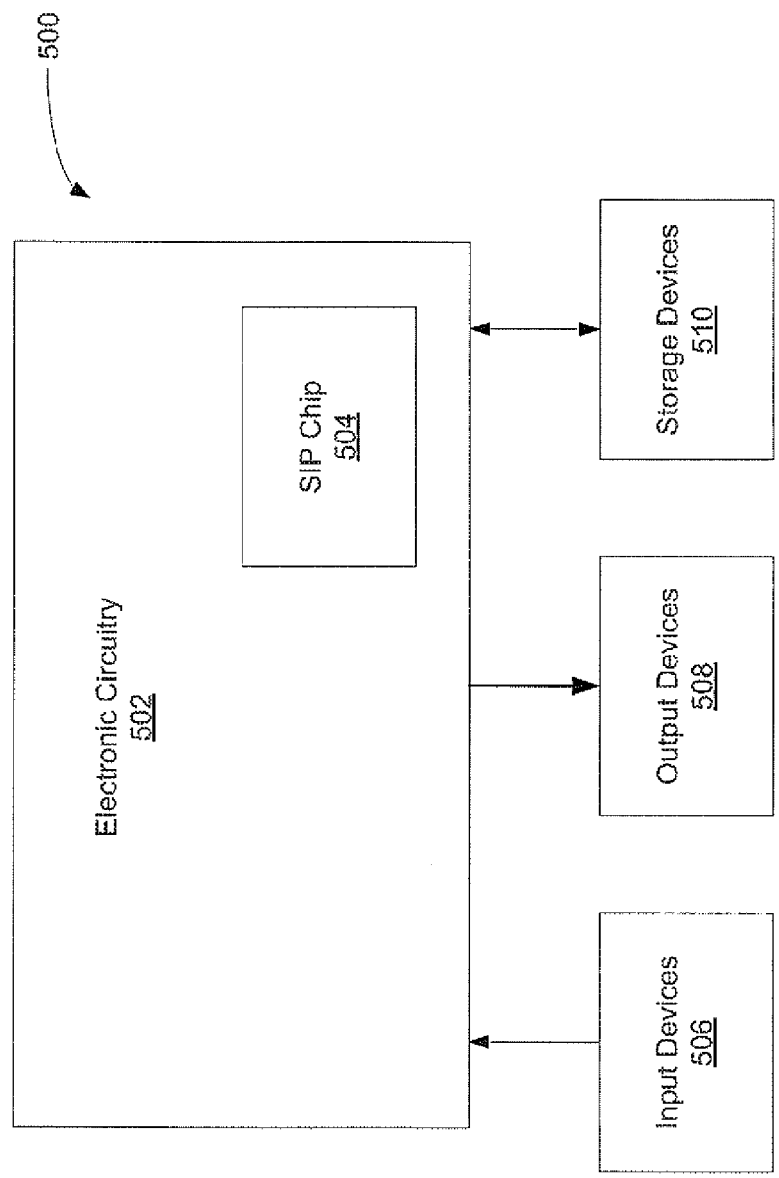
FIG. 5 is a functional block diagram of an electronic system including an SIP chip containing the redistribution layer of FIG. 3 according to another embodiment of the present invention.

FIG. 5 is a functional block diagram of an electronic system 500 including electronic circuitry 502 containing an SIP integrated circuit or chip 504 including the redistribution layer 308 of FIG. 3 according to another embodiment of the present invention. Any types of dies (not shown) may be contained in the SIP chip 504, with the specific dies depending on the required function of the chip. The electronic circuitry 502 is coupled through suitable signal buses to the SIP chip 504 to provide for communicating with the chip. The electronic circuitry 502 includes circuitry for performing required functions, such as executing specific software to perform specific calculations or tasks.

In addition, the electronic system 500 includes one or more input devices 506, such as a keyboard or a mouse, coupled to the electronic circuitry 502 to allow an operator to interface with the system. Typically, the system 500 also includes one or more output devices 508 coupled to the electronic circuitry 502, such output devices typically including a printer and a video terminal. One or more data storage devices 510 are also typically coupled to the electronic circuitry 502 to store data or retrieve data from external storage media (not shown). Examples of typical storage devices 510 include hard and floppy disks, flash cards, compact disk read-only (CD-ROMs) and compact disk read-write (CD-RW) memories, and digital video disks (DVDs). The electronic system 500 may be any type of electronic system, such as a computer system like a personal or server computer system, a portable electronic device like a cellular phone or a personal digital assistant. The die in the chip 504 thus include suitable circuitry to form the SIP chip 504 for use in the desired type of electronic system 500, such as those just mentioned as well as a communications system, printing system, or embedded system for controlling a test instrumentation system.

Even though various embodiments and advantages of the present invention have been set forth in the foregoing description, the above disclosure is illustrative only, and changes may be made in detail and yet remain within the broad principles of the present invention. Moreover, the functions performed by some elements may in some embodiments be combined to be performed by fewer elements, separated and performed by more elements, as will be appreciated by those skilled in the art. Therefore, the present invention is to be limited only by the appended claims.

What is claimed is:

1. An integrated circuit including:
   a first die positioned in a package, the first die comprising a first bond pad; and
   a second die positioned in the package, the second die including
   a redistribution layer formed on the second die, and
   a second bond pad,
   wherein the redistribution layer includes
      a third bond pad, the third bond pad positioned to provide electrical interconnection via a first bonding wire to the first bond pad of the first die,
      a first intermediate bond pad electrically interconnected through a first conductive trace to the second bond pad, and
      a second intermediate bond pad electrically interconnected through a second conductive trace to the third bond pad,
      wherein (i) the first intermediate bond pad and (ii) the second intermediate bond pad are electrically connected through a second bond wire.

2. The integrated circuit of claim 1, wherein the first die is stacked on top of the second die.

3. The integrated circuit of claim 1, wherein the first die and the second die are positioned side-by-side.

4. The integrated circuit of claim 3, wherein the third bond pad is positioned along an inner edge of the second die, the inner edge of the second die being positioned adjacent to an inner edge of the first die.

5. The integrated circuit of claim 1, wherein the third bond pad is configured to communicate one or more of (i) control signals, (ii) address signals, and (iii) data signals between the first die and the second die.

6. The integrated circuit of claim 1, wherein (i) the first die and (ii) the second die are arranged within a lead frame package.

7. The integrated circuit of claim 6, wherein the lead frame package comprises a quad flat package.

8. The integrated circuit of claim 7, wherein:
   the quad flat package includes a lead frame having a die paddle; and each of (i) the first die and (ii) the second die is mounted on the die paddle.

9. The integrated circuit of claim 1, wherein:
the first die includes memory circuitry; and
the second die includes memory controller circuitry.

10. The integrated circuit of claim 1, wherein (i) the first die and (ii) the second die are arranged in a system-in-package.

11. The integrated circuit of claim 1, further comprising a third die including another redistribution layer, the another redistribution layer of the third die including (i) a fourth bond pad and (ii) an intermediate bond pad connected to the fourth bond pad through a third bonding wire.

12. An electronic system, comprising:
an input device;
an output device;
a storage device; and
computer circuitry coupled to each of (i) the input device, (ii) the output device, and (iii) the storage device, the computer circuitry including an integrated circuit, the integrated circuit including
a first die positioned in a package, the first die comprising a first bond pad, and
a second die positioned in the package, the second die including
a redistribution layer formed on the second die, and
a second bond pad,
wherein the redistribution layer includes
a third bond pad, the third bond pad positioned to provide electrical interconnection via a first bonding wire to the first bond pad of the first die,
a first intermediate bond pad electrically interconnected through a first conductive trace to the second bond pad, and
a second intermediate bond pad electrically interconnected through a second conductive trace to the third bond pad,
wherein (i) the first intermediate bond pad and (ii) the second intermediate bond pad are electrically connected through a second bond wire.

13. The electronic system of claim 12 wherein the package comprises a quad flat package.

14. The electronic system of claim 13, wherein:
the quad flat package includes a lead frame having a die paddle; and
each of (i) the first die and (ii) the second die is mounted on the die paddle.

15. The electronic system of claim 12, wherein (i) the first die and (ii) the second die are arranged in a system-in-package.

16. The electronic system of claim 12, wherein:
the first die includes memory circuitry; and
the second die includes memory controller circuitry.

17. The electronic system of claim 12, wherein the electronic system comprises one of (i) a computer system, (ii) a communications system, (iii) a printing system, and (iv) an embedded system for controlling an instrumentation system.

18. The electronic system of claim 12, wherein:
the integrated circuit further comprises a third die including another redistribution layer, the another redistribution layer of the third die including (i) a fourth bond pad and (ii) an intermediate bond pad connected to the fourth bond pad through a third bonding wire.

19. The electronic system of claim 12, wherein:
(i) the first die and (ii) the second die are positioned side-by-side; and
the third bond pad is positioned along an inner edge of the second die, the inner edge of the second die being positioned adjacent to an inner edge of the first die.

20. The electronic system of claim 12, wherein the third bond pad is configured to communicate one or more of (i) control signals, (ii) address signals, and (iii) data signals between the first die and the second die.

* * * * *